(12) United States Patent
Kim

(10) Patent No.: US 10,777,486 B2
(45) Date of Patent: Sep. 15, 2020

(54) SUBSTRATE-FREE SYSTEM IN PACKAGE DESIGN

(71) Applicant: Intel Corporation, Santa Clara, CA (US)

(72) Inventor: Hyoung Il Kim, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/079,532

(22) PCT Filed: Jun. 30, 2016

(86) PCT No.: PCT/US2016/040549
§ 371 (c)(1),
(2) Date: Aug. 23, 2018

(87) PCT Pub. No.: WO2017/164905
PCT Pub. Date: Sep. 28, 2017

(65) Prior Publication Data
US 2019/0051582 A1  Feb. 14, 2019

Related U.S. Application Data

(60) Provisional application No. 62/313,490, filed on Mar. 25, 2016.

(51) Int. Cl.
*H01L 23/00* (2006.01)
*H01L 23/48* (2006.01)
(Continued)

(52) U.S. Cl.
CPC .......... *H01L 23/481* (2013.01); *H01L 21/568* (2013.01); *H01L 21/6835* (2013.01);
(Continued)

(58) Field of Classification Search
CPC combination set(s) only.
See application file for complete search history.

(56) References Cited

U.S. PATENT DOCUMENTS

2010/0091537 A1* 4/2010 Best ...................... G11C 11/406
365/51
2013/0292831 A1  11/2013 Liu et al.
(Continued)

OTHER PUBLICATIONS

International Search Report and Written Opinion, dated Nov. 21, 2016, issued in related International Application No. PCT/US2016/040549, 14 pages.

*Primary Examiner* — Moazzam Hossain
(74) *Attorney, Agent, or Firm* — Schwabe, Williamson & Wyatt, P.C.

(57) ABSTRACT

Apparatuses and processes are disclosed for a substrate-free system in package that includes a through mold via Embodiments may include providing a circuit trace layer on top of a first side of a carrier, coupling a first set of one or more surface mount components to a first side of the circuit trace layer opposite the carrier, embedding the first set of the one or more surface mount components in a molding compound, exposing a second side of the circuit trace layer opposite the first side of the circuit trace layer, and coupling one or more electrical interconnects to serve as TMVs to the second side of the circuit trace layer. Embodiments may also include exposing the second side of the circuit trace layer by grinding the carrier. Other embodiments may be described and/or claimed.

5 Claims, 13 Drawing Sheets

(51) Int. Cl.
    *H01L 23/31*     (2006.01)
    *H01L 23/538*     (2006.01)
    *H01L 25/065*     (2006.01)
    *H01L 23/498*     (2006.01)
    *H01L 21/56*     (2006.01)
    *H01L 21/683*     (2006.01)
    *H01L 25/00*     (2006.01)
    *H01L 25/16*     (2006.01)

(52) U.S. Cl.
    CPC .......... H01L 23/3128 (2013.01); H01L 23/48 (2013.01); H01L 23/49816 (2013.01); H01L 23/5389 (2013.01); H01L 24/17 (2013.01); H01L 25/0652 (2013.01); H01L 25/50 (2013.01); *H01L 21/565* (2013.01); *H01L 23/5383* (2013.01); *H01L 24/13* (2013.01); *H01L 24/16* (2013.01); *H01L 24/48* (2013.01); *H01L 24/73* (2013.01); *H01L 25/16* (2013.01); *H01L 2221/68345* (2013.01); *H01L 2221/68381* (2013.01); *H01L 2224/0237* (2013.01); *H01L 2224/13101* (2013.01); *H01L 2224/16225* (2013.01); *H01L 2224/32145* (2013.01); *H01L 2224/48091* (2013.01); *H01L 2224/48227* (2013.01); *H01L 2224/73253* (2013.01); *H01L 2224/73265* (2013.01); *H01L 2225/0651* (2013.01); *H01L 2225/06513* (2013.01); *H01L 2225/06558* (2013.01); *H01L 2225/06572* (2013.01); *H01L 2924/00014* (2013.01); *H01L 2924/15311* (2013.01); *H01L 2924/15321* (2013.01); *H01L 2924/181* (2013.01); *H01L 2924/19105* (2013.01); *H01L 2924/19106* (2013.01)

(56) References Cited

U.S. PATENT DOCUMENTS

| | | | |
|---|---|---|---|
| 2014/0077361 A1* | 3/2014 | Lin | H01L 22/14 257/737 |
| 2014/0103488 A1 | 4/2014 | Chen et al. | |
| 2015/0008580 A1 | 1/2015 | Joh | |
| 2015/0255447 A1 | 9/2015 | Hung et al. | |
| 2016/0013172 A1 | 1/2016 | Lin et al. | |
| 2016/0263709 A1* | 9/2016 | Cheng | H01L 23/49866 |
| 2016/0300813 A1* | 10/2016 | Zhai | H01L 21/561 |
| 2016/0358889 A1* | 12/2016 | Lai | H01L 23/5389 |
| 2017/0040266 A1* | 2/2017 | Lin | H01L 23/5383 |
| 2017/0077072 A1* | 3/2017 | Yap | H01L 25/105 |
| 2017/0141087 A1* | 5/2017 | Vincent | H01L 25/105 |
| 2019/0051609 A1* | 2/2019 | Hsu | H01L 25/162 |

* cited by examiner

SUBSTRATE-FREE SYSTEM IN PACKAGE DESIGN

CROSS REFERENCE TO RELATED APPLICATIONS

The present application is a national phase entry under 35 U.S.C. § 371 of International Application No. PCT/US2016/040549, filed Jun. 30, 2016, entitled "SUBSTRATE-FREE SYSTEM IN PACKAGE DESIGN", which designates the United States of America, which claims priority to a U.S. Provisional Patent Application No. 62/313,490, entitled "SUBSTRATE-FREE WAFER LEVEL SYSTEM IN PACKAGE DESIGN USING SILICON INTERPOSER AND WAFER LEVEL THROUGH MOLD VIA PROCESS," filed Mar. 25, 2016, the entire disclosures of which are hereby incorporated by reference.

TECHNICAL FIELD

The present disclosure relates generally to the field of system in package (SIP) manufacture, and may be further related to implementing SIPs with a substrate-free design.

BACKGROUND

In legacy implementations for manufacturing a SIP, a film assisted molding process and laser ablation processes may be used to define a through-mold via TMV structure within the SIP that is built using a strip level bismaleimide triazine (BT) substrate. These legacy implementations may produce a result that is not entirely reliable and may be a major source of assembly cost. For example, in legacy implementations, wafer or panel level molding on the secondary side may be implemented using a thin film material placed over components and solder ball mounts, and a vacuum process used to secure the components when applying the molding.

BRIEF DESCRIPTION OF THE DRAWINGS

Embodiments will be readily understood by the following detailed description in conjunction with the accompanying drawings. To facilitate this description, like reference numerals designate like structural elements.

Embodiments are illustrated by way of example, and not by way of limitation, in the figures of the accompanying drawings.

DETAILED DESCRIPTION

Figure 1:
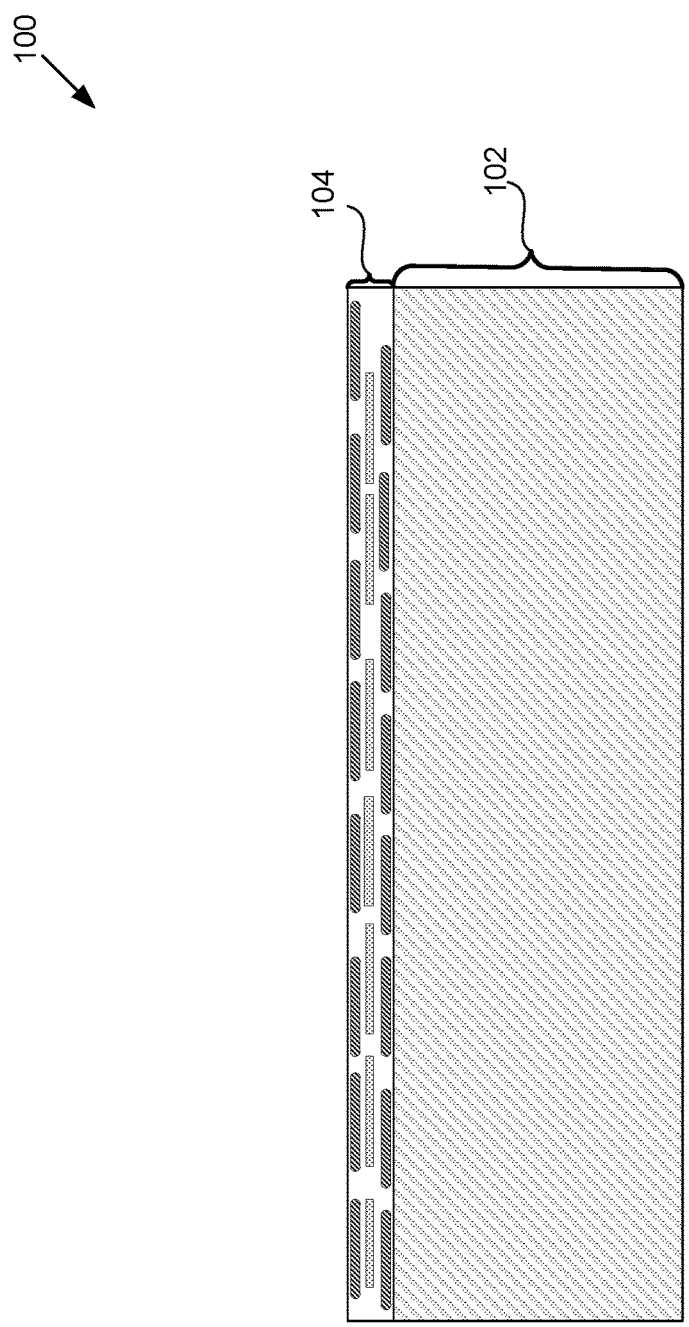
FIG. 1 depicts an example of a wafer or panel level carrier with circuit traces, in accordance with some embodiments.

In embodiments of this disclosure, a system in package (SIP) may be built using a wafer carrier or panel carrier, without the use of a substrate. This may be referred to as a substrate-free SIP. The carrier may have pre-defined circuit traces applied to them. In embodiments, these pre-defined circuits traces may be manufactured, in non-limiting examples, by lithography process or redistribution layer (RDL) technology. Interconnects such as TMV interconnects may be built by coupling solder balls to the circuit traces. The side of the circuit traces having the coupled solder balls may be embedded in molding. The tops of the embedded solder balls may then be removed by wafer level or panel level grinding, resulting in TMV interconnects. In embodiments, extra solder volumes may be added on the top of the TMV interconnects.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer" may mean that the first layer is formed over the second layer, and at least a part of the first layer may be in direct contact (e.g., direct physical and/or electrical contact) or indirect contact (e.g., having one or more other layers between the first layer and the second layer) with at least a part of the second layer.

Embodiments of the present disclosure may result in a significant aggregated Z-height reduction of the SIP, in contrast to legacy techniques, by using a wafer or panel level carrier to create the SIP. In embodiments, the carrier may be thinned down below 100 micrometers (um). The substrate thickness of legacy packages may be about 280 micrometers with six metal layers.

Embodiments of the present disclosure may result in mass production manufacturing/test throughput gains by adopting, for example, a wafer level or panel level manufacturing process to create SIPs. Legacy SIP implementations based on strip level BT substrate design may accommodate less than 50 units per strip. In embodiments, the wafer level or panel level SIP process may produce hundreds of units per wafer or thousands of units per panel. In addition because many critical integrated circuits (ICs), for example central processing units (CPUs), application-specific integrated circuits (ASICs), and other complex ICs, may be tested at wafer or panel level assembly, embodiments of this present disclosure may result in significant test time savings over legacy implementations.

Embodiments of the wafer or panel level interconnect process may also provide increased component integration. In non-limiting examples, embodiments may accommodate more components in a component Z-height and may achieve a smaller aggregated Z-height of the SIP compared to legacy implementations. In embodiments, embedded solder interconnects within a molding compound may be revealed by a wafer or panel level polishing process. In embodiments, the solder interconnects may also serve as TMVs. The process of revealing the embedded solder interconnects may result in further thinning of unnecessary mold cap clearance into which the solder interconnects and other components may be embedded. In legacy implementations, it may be difficult to reduce mold cap clearance under 150 micrometers (um). For example, in some legacy implementations, a film assisted molding process followed by laser ablation may be used to reveal TMV interconnects in legacy implementations and, as a result, about 150 um-thick mold cap clearance may be left between the top of die and the mold top surface.

In addition, in embodiments, package thickness may be controlled by polishing off the top mold; therefore a new mold chase is not required for different package thicknesses. This may result in assembly tool cost savings over legacy systems. Legacy packages that require purchasing new mold chases may cost up to $300,000 per mold or more.

In embodiments, the actions that are described below may be performed in the sequence described, in a different sequence, or in a sequence in which not all of the described actions may be performed.

FIG. 1 depicts an example of a wafer or panel level carrier with circuit traces, in accordance with some embodiments. Diagram 100 shows a carrier 102 with circuit traces 104 attached to the first side of the carrier 102. In embodiments, non-limiting examples of the carrier 102 material may include silicon, stainless steel, and/or glass. The carrier 102 may be a wafer or a panel level carrier. In embodiments, the circuit traces 104 may be determined circuitry that may be placed on one side of the carrier 102. In embodiments, the determined circuitry may be manufactured by lithography process, RDL technology, or by some other process. In embodiments, the circuit traces 104 are designed to carry electrical signals between various surface mount components, to other components that may be within the package, and/or two other. In embodiments, circuit traces 104 may have multiple levels of conductive material that are separated by dielectric, and may have paths for electrical conductivity that connect the multiple levels in one or more places.

Figure 2:
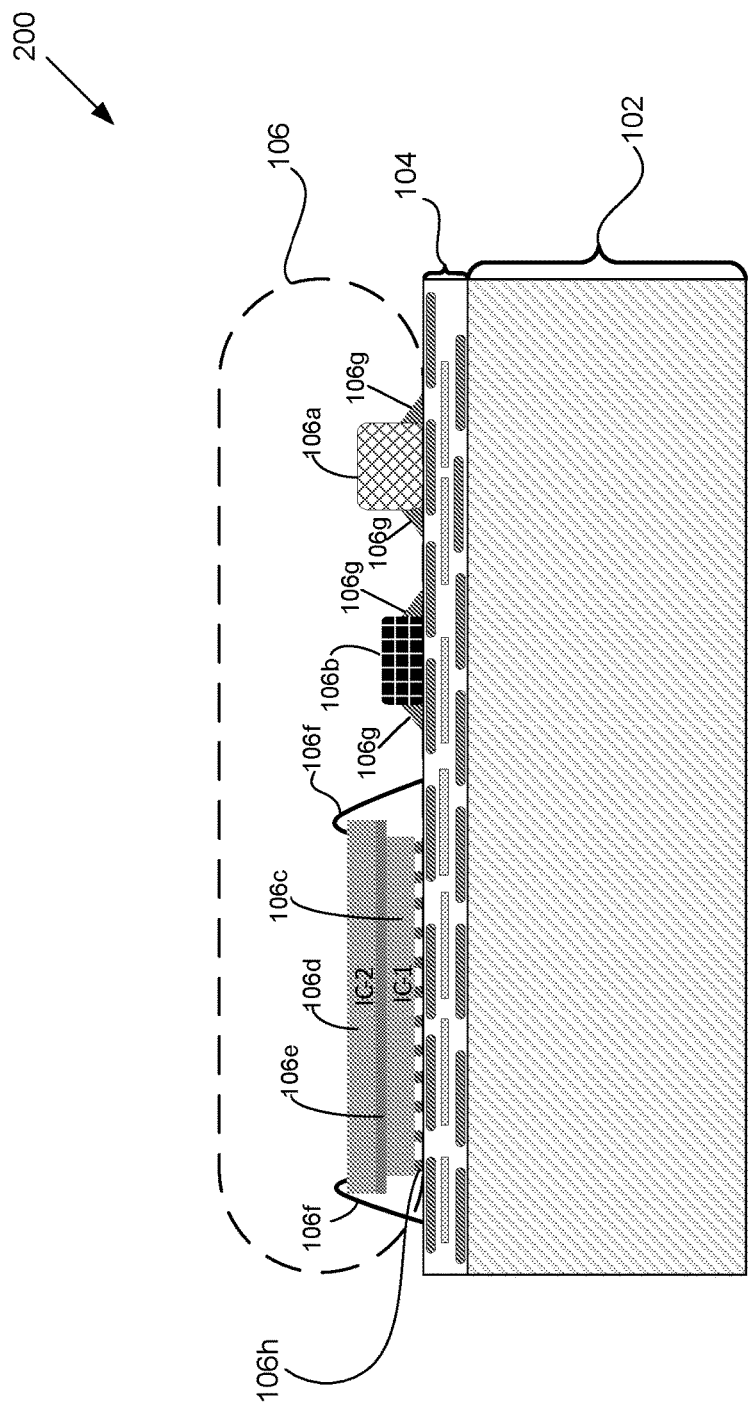
FIG. 2 depicts an example of surface mount components on a primary side of the carrier, in accordance with some embodiments.

FIG. 2 depicts an example of surface mount components on a primary side of the carrier, in accordance with some embodiments. In this disclosure, a primary side is to distinguish from a secondary side of a carrier, and not to necessarily indicate a preferred side. Diagram 200 shows a non-limiting example of surface mount components 106 placed on the primary side of the carrier 102 and coupled with a first side of the circuit traces 104. In embodiments where a silicon or stainless steel carrier is used, because of high thermal conductive properties, components 106 may be assembled by heating the carrier above the melting temperature of solder which may be, in non-limiting examples, above approximately 230° C. In other embodiments, surface mount components 106 may be assembled using a convection reflow process.

In embodiments, surface mount components 106 may include resistance components 106a such as a resistor and/or capacitance components 106b such as a capacitor. In embodiments, other components may be included as well, in a non-limiting example a transistor. These components may be coupled to the circuit traces 104 by solder 106g.

In embodiments, surface mount components 106 may also include integrated circuit components 106c, 106d. In non-limiting examples, an integrated circuit may be a combination of one or more integrated circuits, such as a first integrated circuit 106c that is coupled to a second integrated circuit 106d through a coupling layer 106e. In non-limiting examples, the first integrated circuit 106c may be coupled to the circuit traces 104 by one or more solder balls 106h. In embodiments, wires 106f may be used to couple the second integrated circuit 106d directly to the circuit traces 104. In other embodiments, there may be a single die, more than two dies, multiple dies side by side, and the like coupled to the circuit traces 104.

Figure 3:
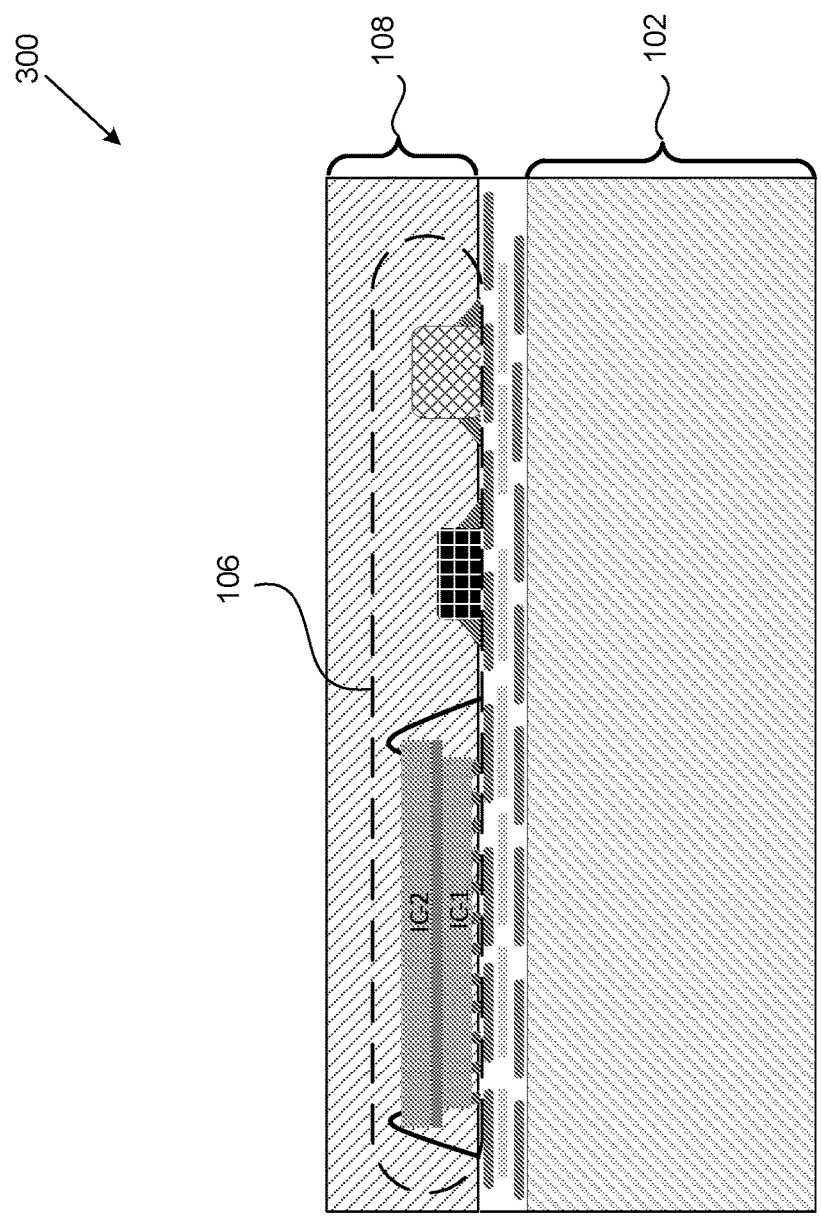
FIG. 3 depicts an example of application of wafer or panel level top molding on the primary side of the carrier, in accordance with some embodiments.

FIG. 3 depicts an example application of applying wafer or panel level top molding on the primary side of the carrier, in accordance with some embodiments. Diagram 300 shows a molding 108 applied to the primary side of the carrier 102. In embodiments, the molding 108 may envelop the surface mount components 106 on the primary side of the carrier 102. In embodiments, a mold compound may be made of a polymer-based material, and transfer or compression molding may be used envelop components such as surface mount components 106.

Figure 4:
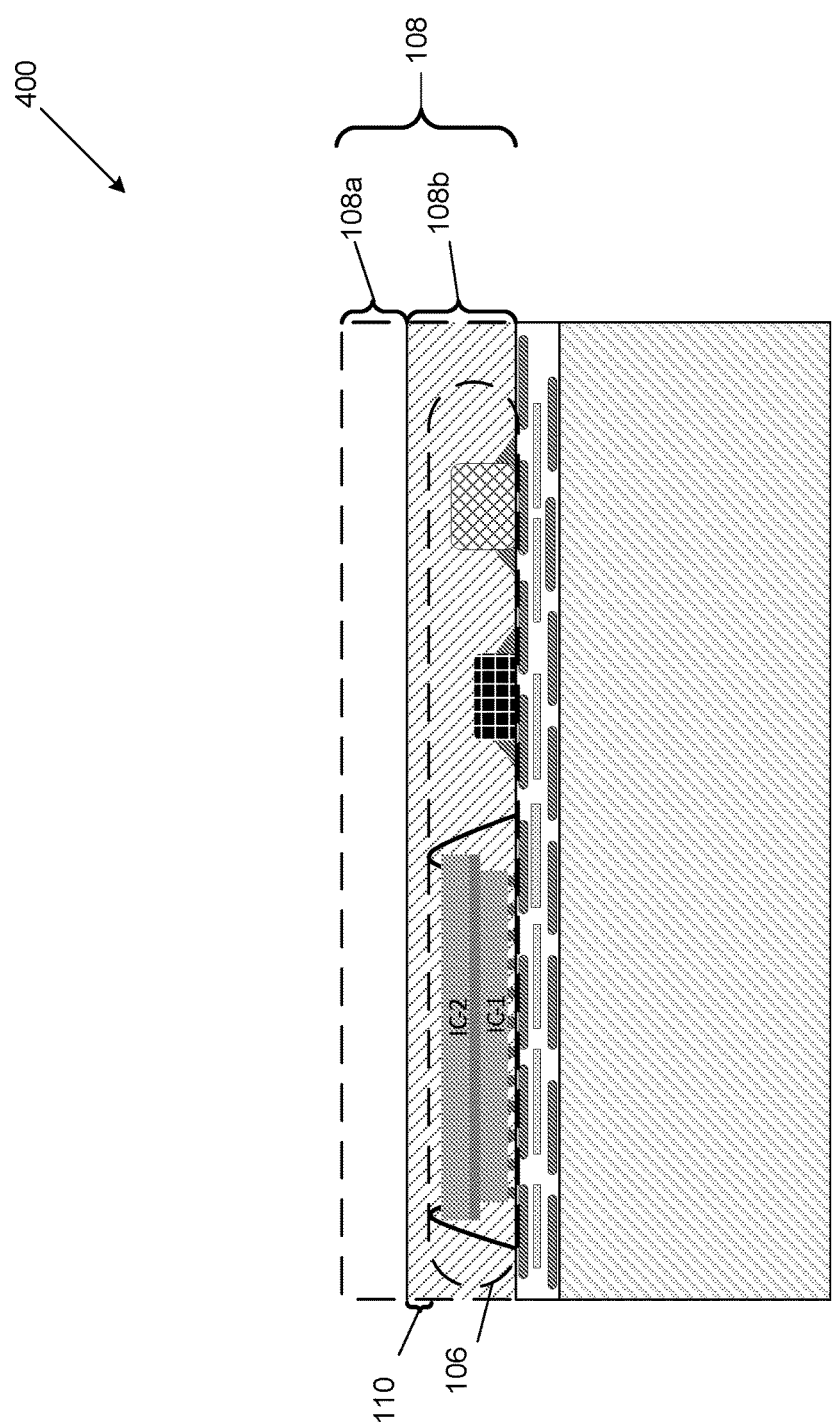
FIG. 4 depicts an example of removal of a portion of a molding compound, in accordance with some embodiments.

FIG. 4 depicts an example of removal of a portion of a molding compound, in accordance with some embodiments. Diagram 400 shows a top portion 108a that has been removed, leaving the remaining molding 108b. In embodiments, surface mount components 106 may still be embedded in the remaining molding 108b. In embodiments, the top portion 108a may be removed using wafer or panel level grinding on the mold compound 108. In embodiments, this may be conventional mechanical grinding using polishing papers or sanding papers. In embodiments, a tight mold cap clearance 110 may be achieved by grinding off the portion of the molding compound 108a to a point proximate to the surface mount components 106.

Figure 5:
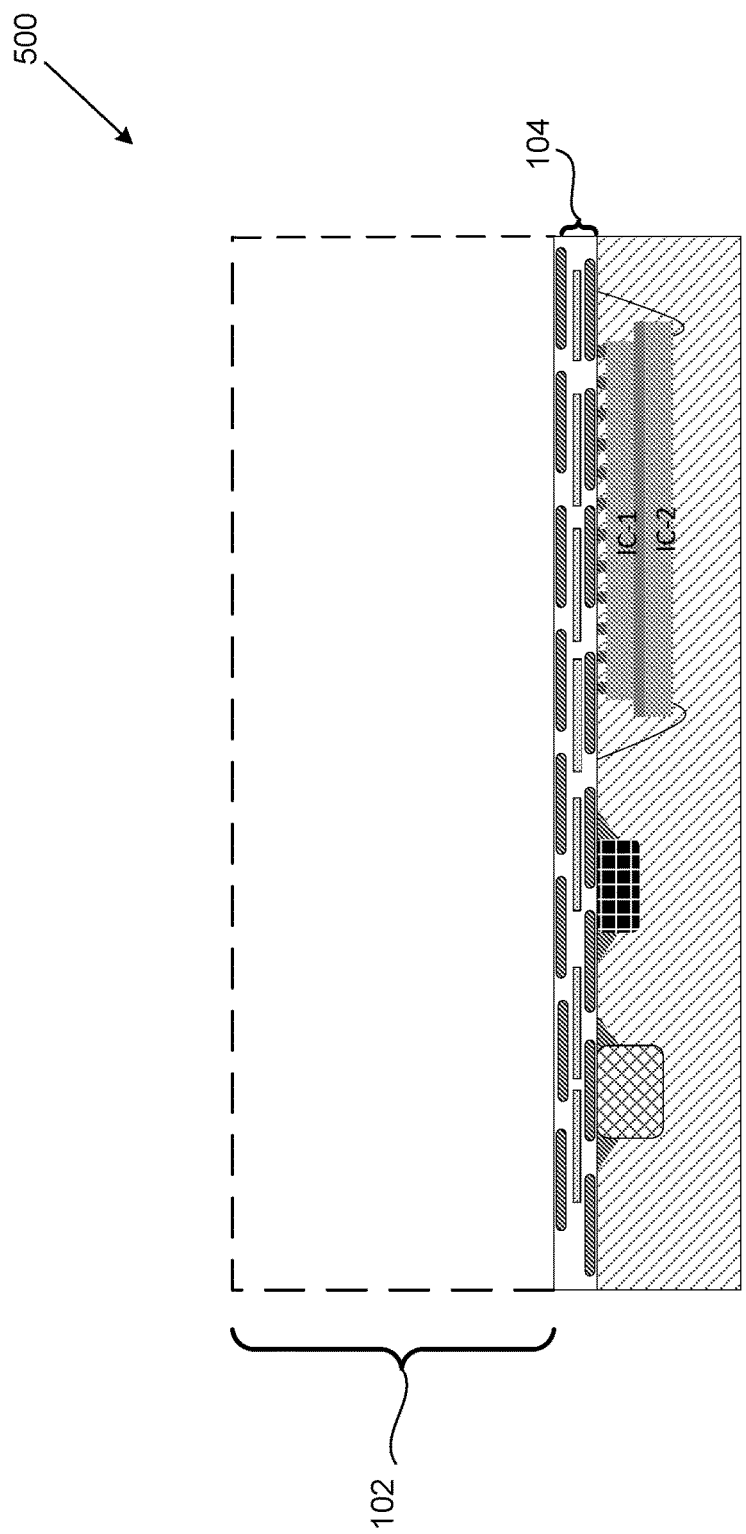
FIG. 5 depicts an example of removal of the wafer or panel level carrier to expose a second side of the circuit traces, in accordance with some embodiments.

FIG. 5 shows an example of removal of the wafer or panel level carrier to expose a second side of the circuit traces, in accordance with some embodiments. Diagram 500 shows the package of diagram 400 that has been flipped, and the carrier 102 has been removed. In embodiments, the removal may be done by a grinding process that exposes the second side of circuit traces 104. In embodiments, this may expose the metal bond pad (not shown for the sake of clarity) that may be used for component placement on the second side of the circuit traces 104. In embodiments, a highly uniform grinding may be achieved.

Figure 6:
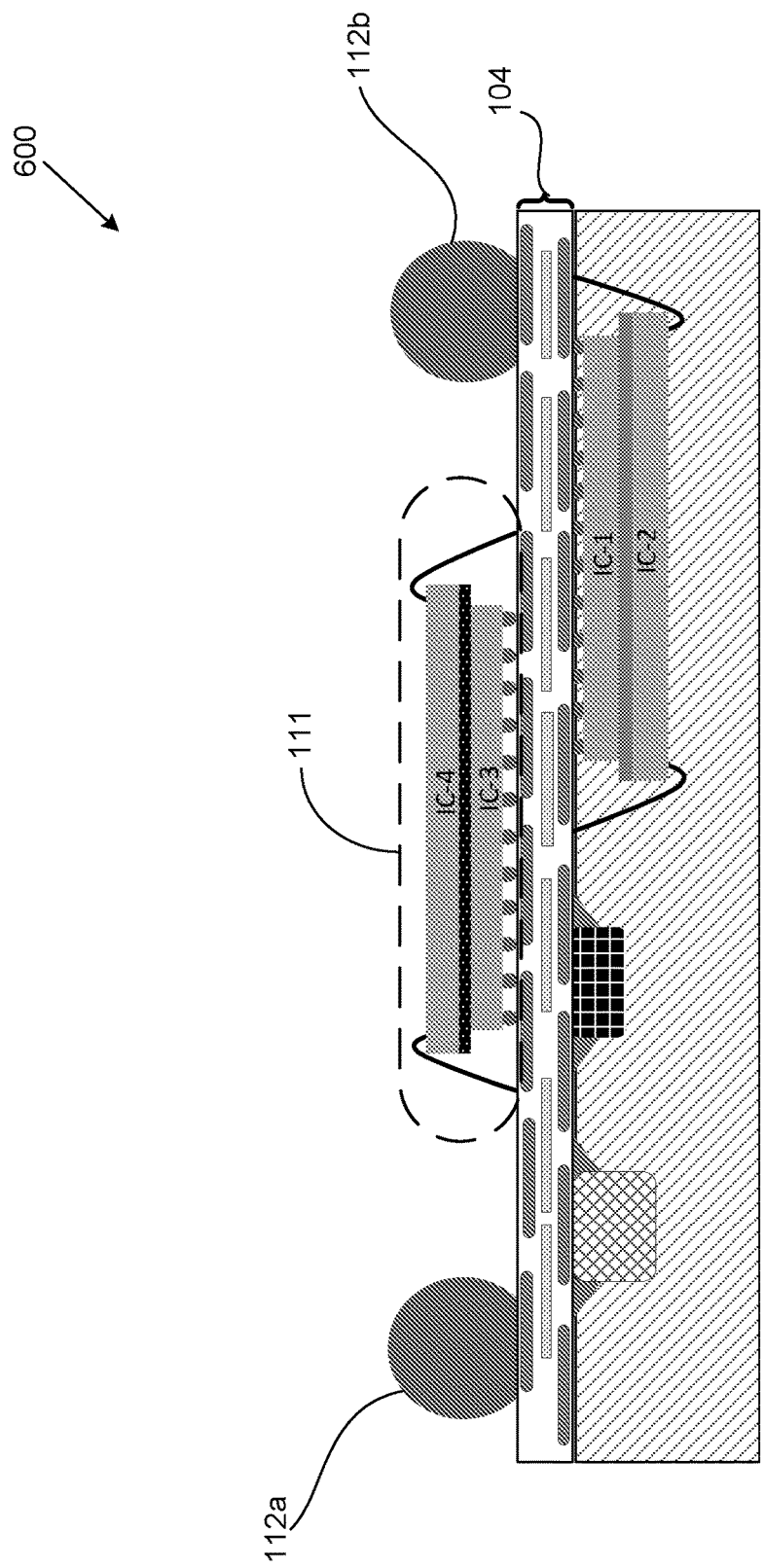
FIG. 6 depicts an example placement of components, solder ball mounts, and subsequent reflow on the secondary side of the circuit traces, in accordance with some embodiments.

FIG. 6 depicts an example placement components, solder ball mounts and subsequent reflow on the second side of the circuit traces, in accordance with some embodiments. In embodiments, an air convection or infrared reflow system may be used. In one example of a wafer-level SiP, reflow may be done with a rotating reflow machine. In another example, for panel level SiP, a conveyor-type reflow machine may be used.

Diagram 600 shows surface mount components 111 that are coupled to the second side of the circuit traces 104. In embodiments, the surface mount components 111 may include a single IC, more than two ICs, adjacent ICs, capacitors, resistors, and or some other surface mount component. In embodiments, solder balls 112*a*, 112*b* are coupled to the second side of the circuit traces 104. In embodiments, the solder balls 112*a* and 112*b* may serve as TMVs as described later in FIG. 9.

Figure 7:
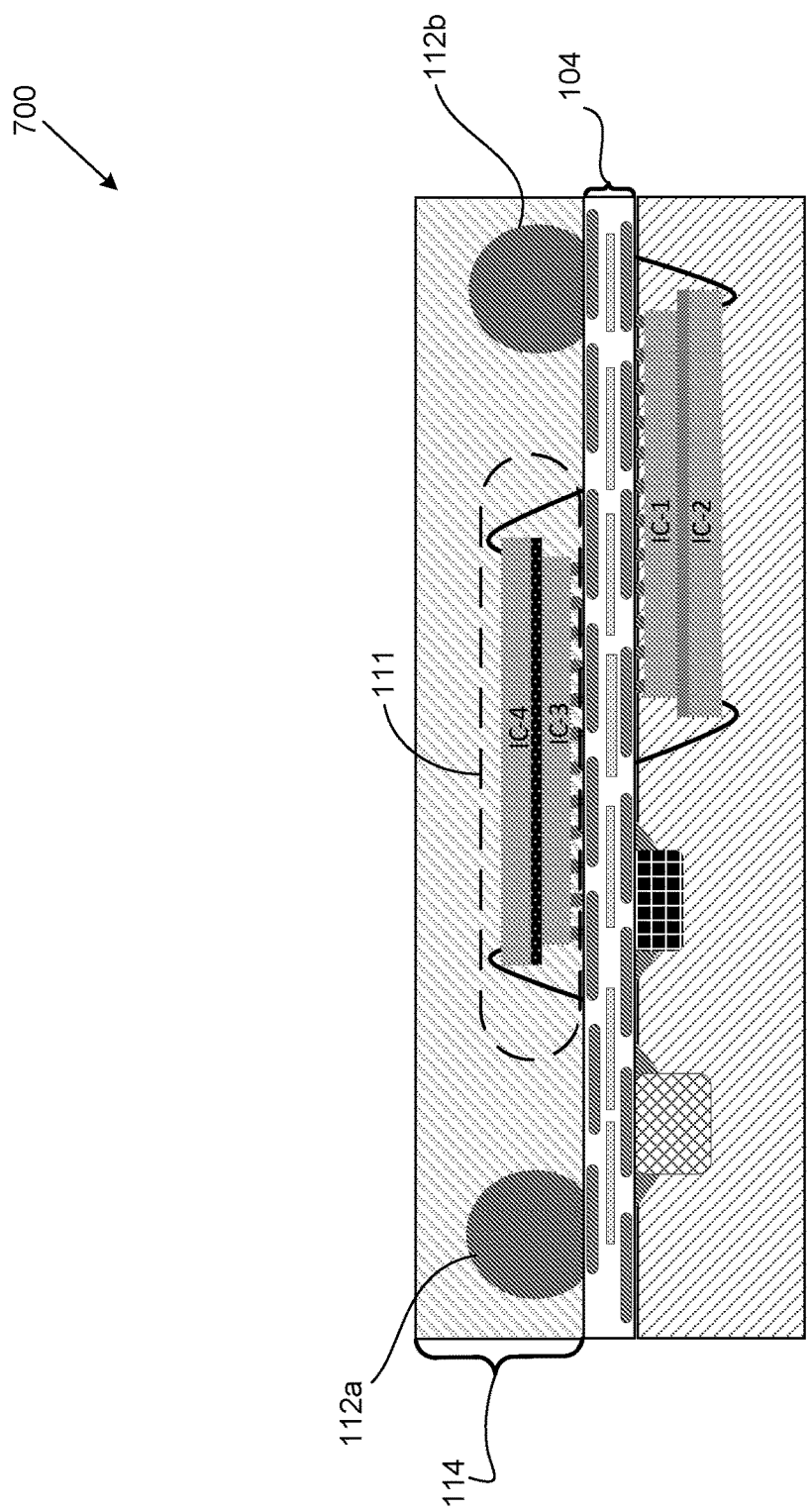
FIG. 7 depicts an example of wafer or panel level molding on the second side of the circuit traces, in accordance with some embodiments.

FIG. 7 depicts an example of wafer or panel level molding on the second side of the circuit traces, in accordance with some embodiments. Diagram 700 shows a molding 114 introduced on the second side of the circuit traces 104. In embodiments molding 114 may be in a similar fashion to molding 108, or may be applied in a different fashion. In embodiments, the molding 114 may completely envelop the components 111 and solder balls 112*a*, 112*b*.

Figure 8:
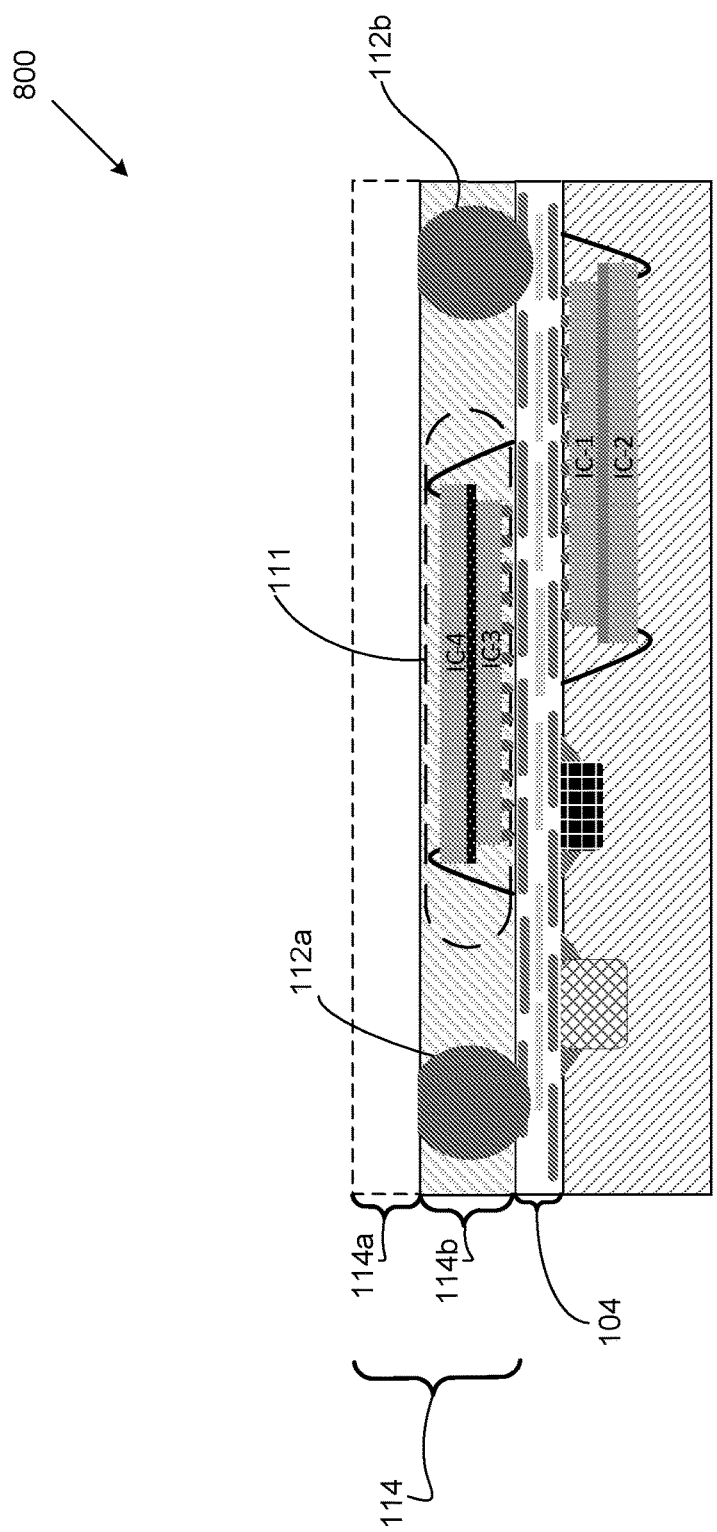
FIG. 8 depicts an example of at least partial exposure of\ solder balls, in accordance with some embodiments.

FIG. 8 depicts an example of at least partial exposure of solder balls, in accordance with some embodiments. Diagram 800 shows a section of molding 114 that has been removed 114*a*, leaving the remaining molding 114*b*. In embodiments, the tops of solder balls 112*a*, 112*b* may be exposed to provide electrical conductivity to the circuit traces 104. In embodiments, the components 111 may continue to be enveloped within the residual molding 114*b*. In embodiments, the removal process may be a wafer or panel level grinding or polishing process. Using such a process may result in a substantial reduction in unpredictable extensions and deformities that may occur if laser drills were used to expose the top of solder balls.

Figure 9:
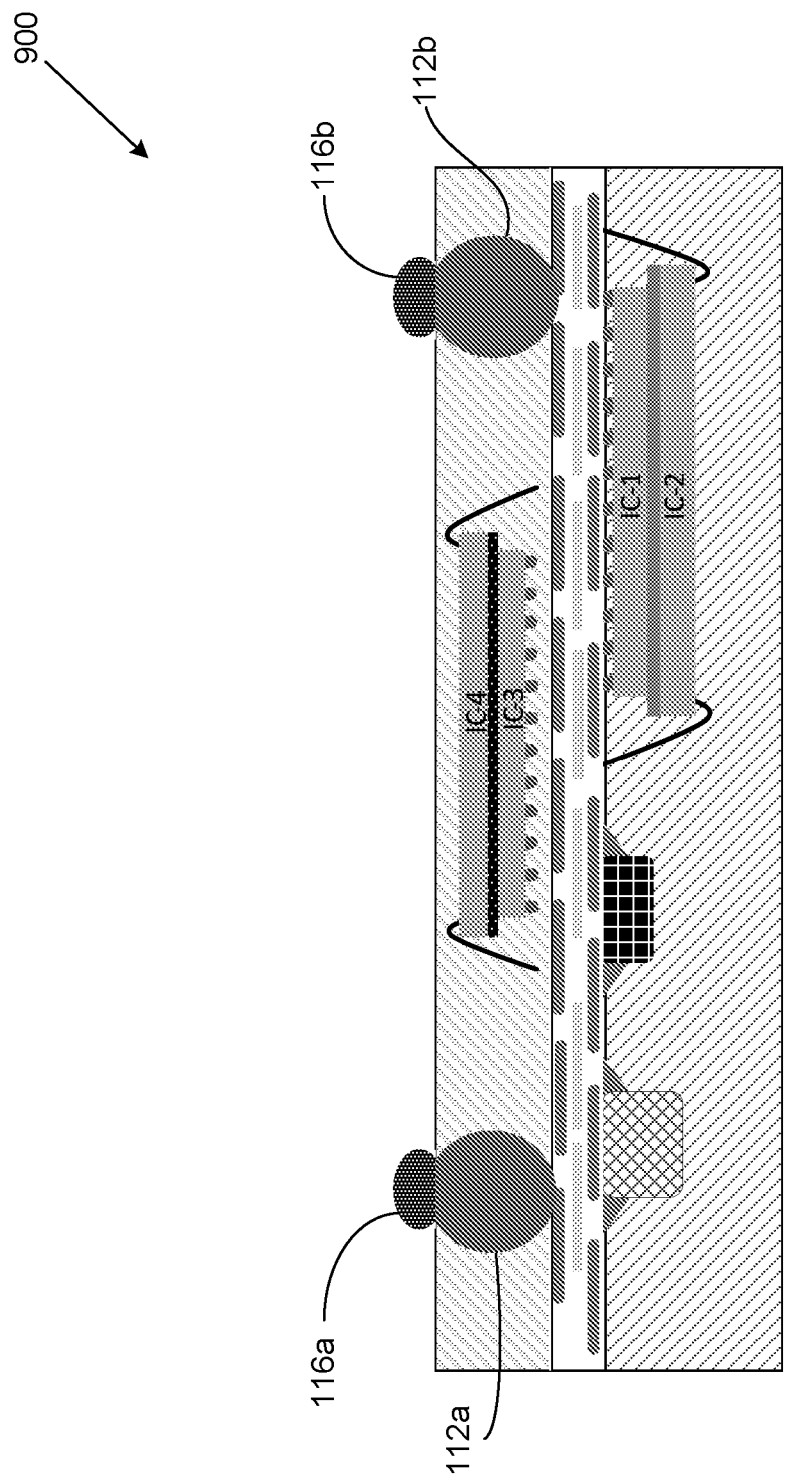
FIG. 9 depicts an example of additional solder to the revealed partial solder balls, in accordance with some embodiments.

FIG. 9 shows adding additional solder to the revealed partial solder balls, in accordance with some embodiments. Diagram 900 shows additional solder 116*a*, 116*b* added to the solder balls 112*a*, 112*b*. In embodiments, a solder mound may be defined by printing solder pastes with a solder stencil process or by picking and placing micro-solder balls individually. In embodiments, this may allow an easier electrical coupling between the SIP and the components to which the SIP may be attached.

Figure 10:
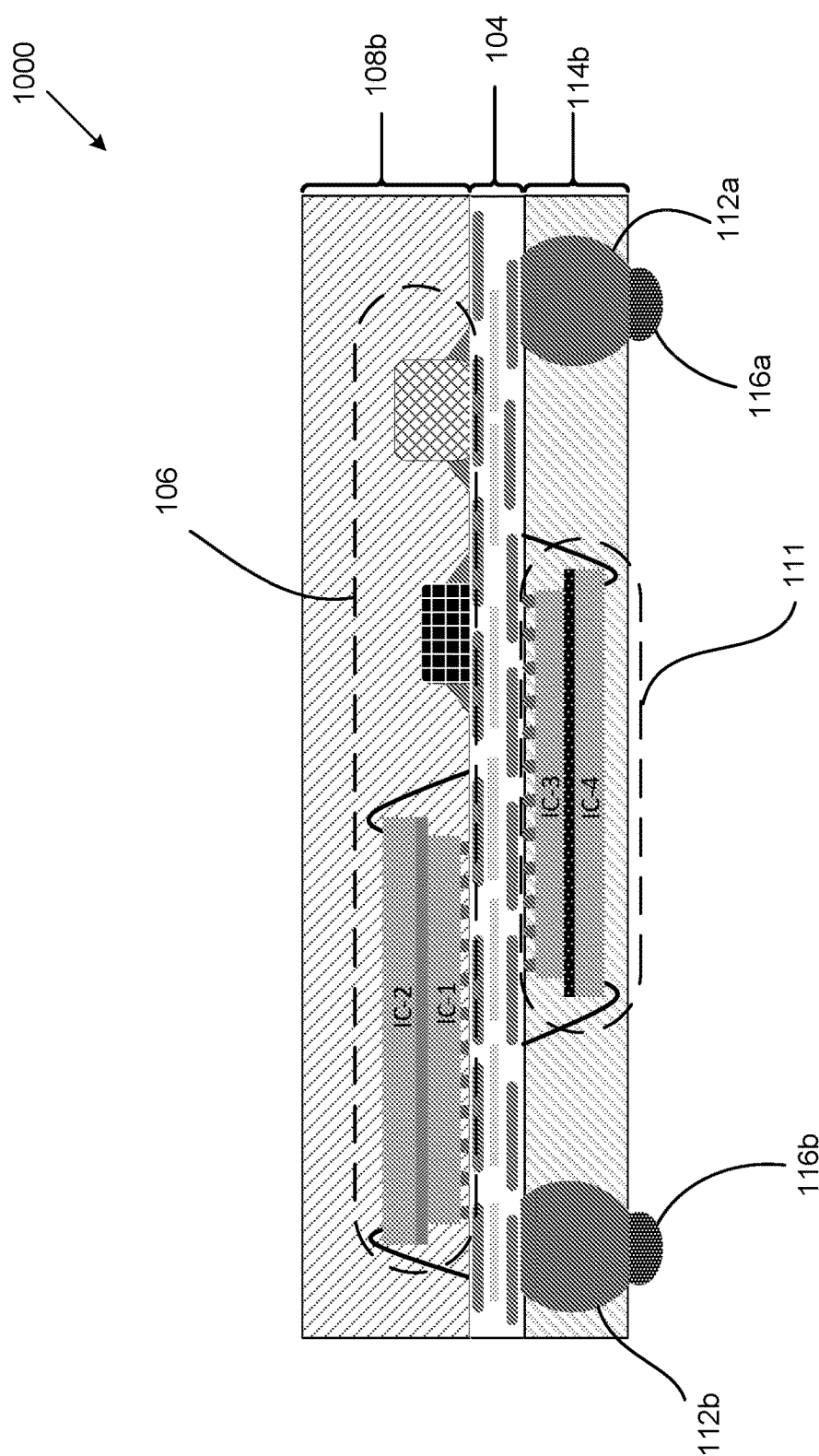
FIG. 10 depicts an example substrate-free SIP with TMVs, in accordance with some embodiments.

FIG. 10 depicts an example substrate-free SIP with TMVs, in accordance with some embodiments. Diagram 1000 shows a first set of components 106 electrically coupled to a first side of circuit traces 104. A second set of components 111 electrically coupled to a second side of circuit traces 104. The remaining molding 108*b* envelops the first set of components 106 and at least a portion of the first side of the circuit traces 104. A second molding 114*b* envelops the second set of components 111, and may surround, but not completely envelop, solder balls 112*a*, 112*b* that may serve as TMVs. An additional solder paste stencil or solder balls 116*a*, 116*b* may be attached to the exposed portion of solder balls 112*a*, 112*b* that may form TMVs.

Figure 11:
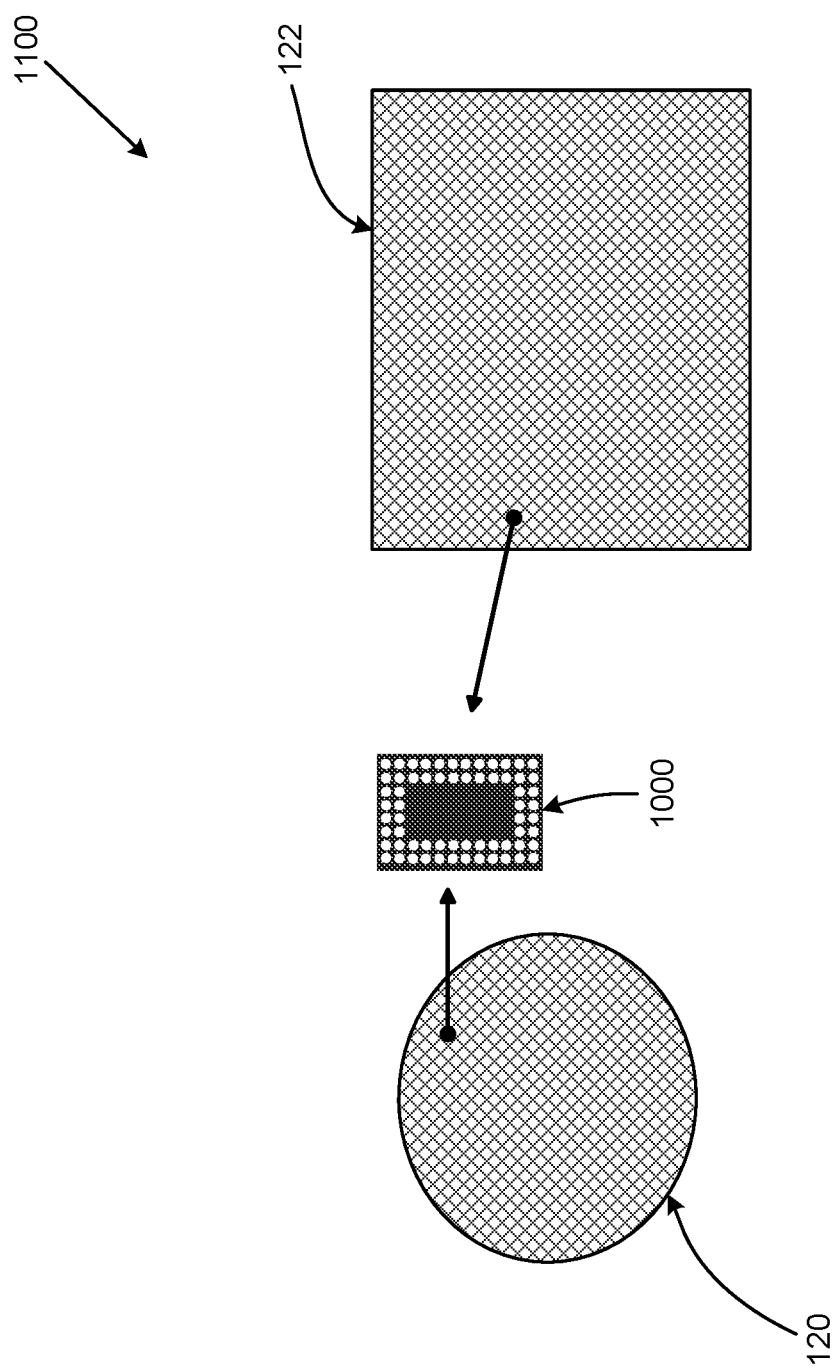
FIG. 11 depicts an example of dicing wafer or panel level packages and harvesting final SIP components, in accordance with some embodiments.

FIG. 11 depicts an example of dicing wafer or panel level packages and harvesting final SIP components, in accordance with some embodiments.

Diagram 1100 shows a wafer 120 that includes a plurality of substrate-free SIPs 1000, and also a panel 122 that includes a plurality of substrate-free SIPs 1000. In embodiments, one or more processes as described in FIG. 1 through FIG. 9 may be applied to create the wafer 120 or the panel 122 that contain a plurality of substrate-free SIPs. Once the wafer 120 or the panel 122 has been created, they may be diced to separate the individual SIPs 1000. In embodiments, this may be accomplished using a diamond blade sawing process, laser cut process, or plasma etching process.

Figure 12:
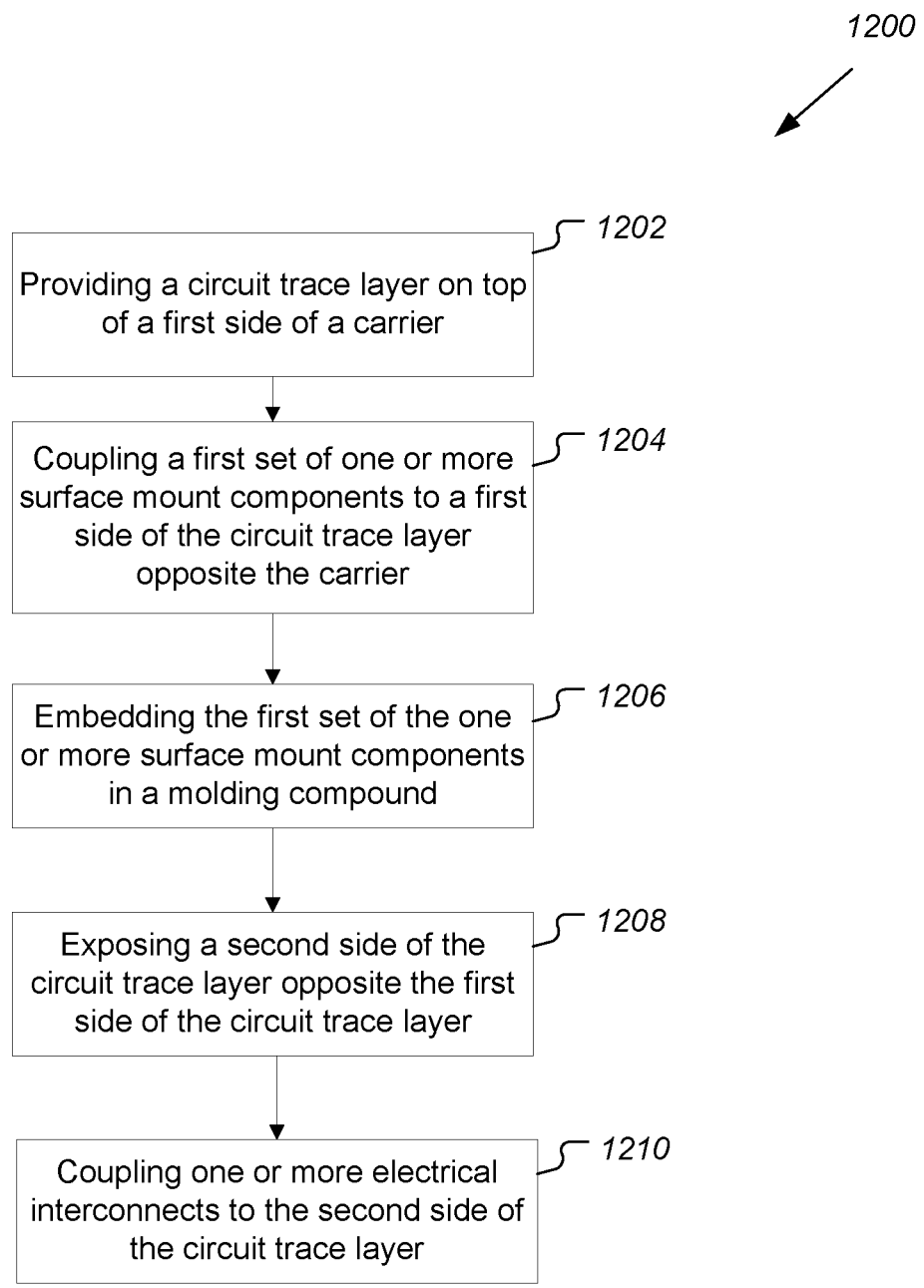
FIG. 12 depicts an example process for creating a substrate-free SIP, in accordance with some embodiments.

FIG. 12 depicts an example process for creating a substrate-free SIP, in accordance with some embodiments. Process 1200 may be used to create a substrate-free SIP, such as package assembly 1000, in accordance with some embodiments.

At block 1202, the process may include providing a circuit trace layer on top of a first side of a carrier. In embodiments, the circuit trace layer may be similar to the circuit traces 104 shown in FIG. 1. In embodiments, the circuit trace layer may be manufactured by a lithography process or redistribution layer (RDL) technology applied to the first side of the carrier. In embodiments, the carrier may be a wafer carrier, a panel level carrier, or some other carrier and may be similar to the carrier 102 shown in FIG. 1. In embodiments, the carrier may be made of material that may include silicon, stainless steel, and/or glass.

At block 1204, the process may include coupling a first set of one or more surface mount components to a first side of the circuit trace layer opposite the carrier. As discussed above, the first set of one or more surface mount components may be similar to the surface mount components 106 as shown in FIG. 1. The components may include integrated circuits 106*c*, 106*d*, resistance components 106*a*, capacitance components 106*b*, and/or some other components. In embodiments, the components may be coupled to the circuit trace layer, which may be similar to circuit trace layer 104 of FIG. 2.

At block 1206, the process may include embedding the first set of the one or more surface mount components in a molding compound. In embodiments, the one or more surface mount components may be similar to the surface mount components 106 as shown in FIG. 1. The molding compound may be similar to molding compound 108 shown in FIG. 3.

At block 1208, the process may include exposing a second side of the circuit trace layer opposite the first side of the circuit trace layer. In embodiments, this may be similar to the top side of circuit trace layer 104 as shown in FIG. 5, after the carrier 102 has been removed.

At block 1210, the process may include coupling one or more electrical interconnects to the second side of the circuit trace layer. In embodiments, the electrical interconnects may be solder balls 112*a*, 112*b* shown in FIG. 6. As discussed above, in embodiments the electrical interconnects may be coupled to a second side of the circuit traces 104.

Figure 13:
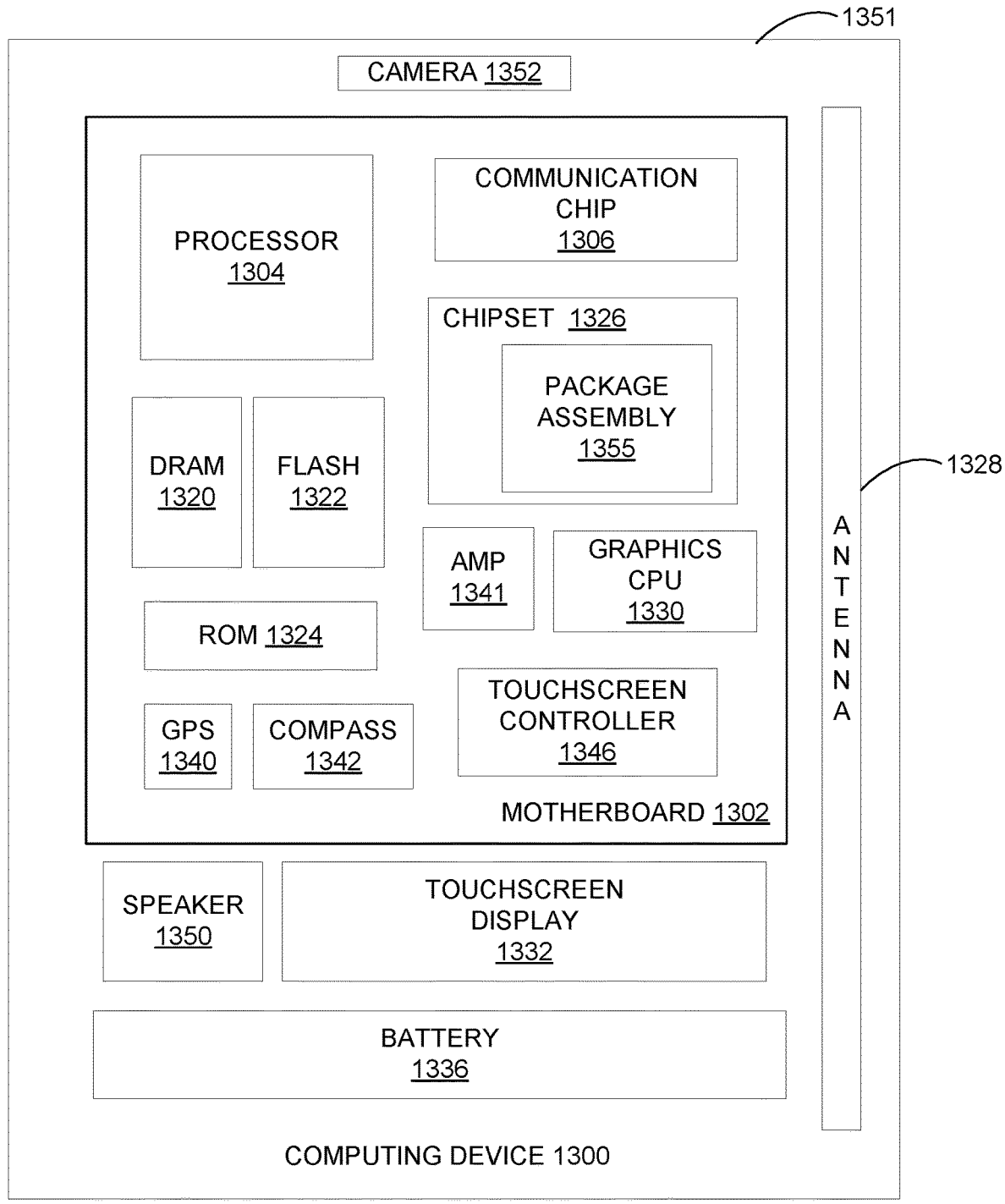
FIG. 13 schematically illustrates an example computing device, in accordance with some embodiments.

FIG. 13 schematically illustrates a computing device 1300, in accordance with some embodiments, which may include one or more package assembly 1000 shown in FIG. 10.

Embodiments of the present disclosure may be implemented into a system using any suitable hardware and/or software to configure as desired. FIG. 13 schematically illustrates a computing device 1300 in accordance with one embodiment. The computing device 1300 may house a board such as motherboard 1302 (i.e., housing 1351). The motherboard 1302 may include a number of components, including but not limited to a processor 1304 and at least one communication chip 1306. The processor 1304 may be physically and electrically coupled to the motherboard 1302. In some implementations, the at least one communication chip 1306 may also be physically and electrically coupled to the motherboard 1302. In further implementations, the communication chip 1306 may be part of the processor 1304.

Depending on its applications, computing device 1300 may include other components that may or may not be physically and electrically coupled to the motherboard 1302. These other components may include, but are not limited to, volatile memory (e.g., dynamic read-only memory (DRAM)) 1320, non-volatile memory (e.g., read-only memory (ROM)) 1324, flash memory 1322, a graphics processor 1330, a digital signal processor (not shown), a crypto processor (not shown), a chipset 1326, an antenna 1328, a display (not shown), a touchscreen display 1332, a touchscreen controller 1346, a battery 1336, an audio codec (not shown), a video codec (not shown), a power amplifier (AMP) 1341, a global positioning system (GPS) device 1340, a compass 1342, an accelerometer (not shown), a gyroscope (not shown), a speaker 1350, a camera 1352, and a mass storage device (such as hard disk drive, compact disk (CD), digital versatile disk (DVD), solid state drive, and so forth) (not shown). Further components, not shown in FIG. 13, may include a microphone, a filter, an oscillator, a pressure sensor, or a radio frequency identification (RFID) chip. In embodiments, one or more of the package assembly components 1355 may be a package assembly such as package assembly 1000 shown in FIG. 10.

The communication chip 1306 may enable wireless communications for the transfer of data to and from the computing device 1300. The term "wireless" and its derivatives may be used to describe circuits, devices, systems, processes, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1306 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1306 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1306 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 306 may operate in accordance with other wireless protocols in other embodiments.

The computing device 1300 may include a plurality of communication chips 1306. For instance, a first communication chip 1306 may be dedicated to shorter range wireless communications such as Wi-Fi and Bluetooth and a second communication chip 1306 may be dedicated to longer range wireless communications such as GPS, EDGE, GPRS, CDMA, WiMAX, LTE, EV-DO, and others.

The processor 1304 of the computing device 1300 may include a die in a package assembly such as, for example, package assembly 1000 shown in FIG. 10 and described herein. The term "processor" may refer to any device or portion of a device that processes electronic data from registers and/or memory to transform that electronic data into other electronic data that may be stored in registers and/or memory.

In various implementations, the computing device 1300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1300 may be any other electronic device that processes data.

The following paragraphs provide examples of various ones of the embodiments disclosed herein.

Example 1 may be a system in package, SIP, comprising: a redistribution layer having a first and a second side opposite the first side; one or more components coupled to the first side, the one or more components having an aggregated total Z height above the first side of the redistribution layer, the Z height measured in a direction perpendicular to the first side or the second side; and one or more electrical interconnects coupled to the first side, the electrical interconnects having a Z height greater than the aggregated total Z height of the one or more components; wherein the one or more components, the one or more electrical interconnects, and the redistribution layer are embedded in a molding compound, the molding compound having one or more openings to expose the electrical interconnects.

Example 2 may include the subject matter of Example 1, wherein the electrical interconnects are solder balls.

Example 3 may include the subject matter of Example 1, wherein having one or more openings to expose the electrical interconnects further comprises expose the electrical interconnects by a grinding process.

Example 4 may include the subject matter of Example 1, wherein the electrical interconnects are through mold vias, TMV.

Example 5 may include the subject matter of Example 1, wherein the one or more components are a first set of one or more components, and the SIP further comprises a second set of components coupled to the second side of the redistribution layer.

Example 6 may include the subject matter of Example 5, wherein the second set of components is within a molding layer.

Example 7 may include the subject matter of any Examples 1 to 6, wherein the one or more components are integrated circuit components or resistance and capacitance components.

Example 8 may be a method for creating a substrate-free system in package, SIP, the method comprising: providing a circuit trace layer on top of a first side of a carrier; coupling a first set of one or more surface mount components to a first side of the circuit trace layer opposite the carrier; embedding the first set of the one or more surface mount components in a molding compound; exposing a second side of the circuit trace layer opposite the first side of the circuit trace layer; and coupling one or more electrical interconnects to the second side of the circuit trace layer.

Example 9 may include the subject matter of Example 8, wherein the electrical interconnects are solder balls.

Example 10 may include the subject matter of Example 8, further comprising coupling a second set of one or more surface mount components to the second side of the circuit trace layer.

Example 11 may include the subject matter of any Examples 9 to 10, further comprising embedding the one or more electrical interconnects coupled to the second side of the circuit trace layer in a molding compound.

Example 12 may include the subject matter of Example 11, further comprising exposing a surface of the one or more electrical interconnects.

Example 13 may include the subject matter of Example 12, wherein exposing a surface of the one or more electrical interconnects comprises exposing a surface of the one or more electrical interconnects by grinding.

Example 14 may include the subject matter of any Examples 11 to 12, wherein the electrical interconnects are through mold vias, TMV.

Example 15 may include the subject matter of any Examples 8 to 10, wherein exposing a second side of the circuit trace layer opposite the first side of the circuit trace layer further includes removing the carrier to expose the second side of the circuit trace layer.

Example 16 may include the subject matter of Example 15, wherein removing the carrier further includes removing the carrier using a grinding process.

Example 17 may include the subject matter of any Examples 8 to 10, wherein the circuit trace layer further comprises a redistribution layer.

Example 18 may include the subject matter of any Examples 8 to 10, wherein the carrier further comprises a wafer carrier or a panel level carrier.

Example 19 may include the subject matter of any Examples 8 to 10, wherein the carrier is made of silicon, glass, or stainless steel.

Example 20 may include the subject matter of any Examples 8 to 10, wherein the one or more surface mount components are integrated circuit components or resistance and capacitance components.

Example 21 may be a computing device that includes: a substrate; and a system in package, SIP, coupled with the substrate, the SIP comprising: a redistribution layer having a first and a second side opposite the first side; one or more components coupled to the first side, the one or more components having an aggregated total Z height above the first side of the redistribution layer, the Z height measured in a direction perpendicular to the first side or the second side; and one or more electrical interconnects coupled to the first side, the electrical interconnects having a Z height greater than the aggregated total Z height of the one or more components; wherein the one or more components, the one or more electrical interconnects, and the redistribution layer are embedded in a molding compound, the molding compound having one or more openings to expose the electrical interconnects.

Example 22 may include the subject matter of Example 21, wherein the electrical interconnects are solder balls.

Example 23 may include the subject matter of Example 21, wherein having one or more openings to expose the electrical interconnects further comprises expose the electrical interconnects by a grinding process.

Example 24 may include the subject matter of any Examples 21 to 23, wherein the electrical interconnects are through mold vias, TMV.

Example 25 may include the subject matter of Example 21, wherein the one or more components are a first set of one or more components, and the SIP further comprising a second set of components coupled to the second side of the redistribution layer.

Example 26 may include the subject matter of Example 25, wherein the second set of components is within a molding layer.

Example 27 may include the subject matter of any Examples 21 to 23, wherein the one or more components are integrated circuit components or resistance and capacitance components.

What is claimed is:

1. A system in package, SIP, comprising:
    a redistribution layer having a first side and a second side opposite the first side, wherein the redistribution layer comprises multiple subsets of a plurality of circuit traces that are separated by dielectric, and have paths for electrical conductivity that connect the subsets of the plurality of circuit traces in one or more places;
    one or more first surface mount components coupled to the first side of the redistribution layer, wherein the one or more first surface mount components are electrically coupled with at least a first subset of the plurality of circuit traces, wherein the first surface mount components include one or more resistance components and/or capacitance components;
    a first molding compound disposed on the first side of the redistribution layer to embed the one or more first surface mount components;
    one or more second surface mount components coupled to the second side of the redistribution layer, wherein the one or more second surface mount components are electrically coupled with at least a second subset of the plurality of circuit traces, wherein the second surface mount components include an integrated circuit;
    one or more electrical interconnects coupled to the second side of the redistribution layer, wherein the electrical interconnects are electrically coupled to at least a third subset of the plurality of circuit traces; and
    a second molding compound disposed on the second side of the redistribution layer to embed the one or more second surface mount components and to envelop the one or more electrical interconnects, wherein the one or more interconnects comprise one or more solder balls, wherein the second molding compound includes one or more openings to expose respective top surfaces of the one or more solder balls to provide electrical connectivity between the solder balls and the third subset of the plurality of circuit traces,
    wherein a total Z-height of the first and second molding compounds comprises 100 micrometers or less.

2. The SIP of claim 1, wherein having one or more openings to expose the electrical interconnects further comprises expose the electrical interconnects by a grinding process.

3. The SIP of claim 1, wherein the electrical interconnects include through mold vias, TMV.

4. The SIP of claim 1, wherein the one or more first surface mount components are integrated circuit components or resistance and capacitance components.

5. A computing device that includes:
a motherboard; and
a system in package, SIP, coupled with the motherboard, the SIP comprising:
a redistribution layer having a first and a second side opposite the first side, wherein the redistribution layer comprises multiple subsets of a plurality of circuit traces that are separated by dielectric, and have paths for electrical conductivity that connect the subsets of the plurality of circuit traces in one or more places;
one or more first surface mount components coupled to the first side of the redistribution layer, wherein the one or more first surface mount components are electrically coupled with at least a first subset of the plurality of circuit traces, wherein the first surface mount components include one or more resistance components and/or capacitance components;
a first molding compound disposed on the first side of the redistribution layer to embed the one or more first surface mount components;
one or more second surface mount components coupled to the second side of the redistribution layer, wherein the one or more second surface mount components are electrically coupled with at least a second subset of the plurality of circuit traces, wherein the second surface mount components include an integrated circuit;
one or more electrical interconnects coupled to the second side of the redistribution layer, wherein the electrical interconnects are electrically coupled to at least a third subset of the plurality of circuit traces; and
a second molding compound disposed on the second side of the redistribution layer to embed the one or more second surface mount components and to envelop the one or more electrical interconnects, wherein the one or more interconnects comprise one or more solder balls, wherein the second molding compound includes one or more openings to expose respective top surfaces of the one or more solder balls to provide electrical connectivity between the solder balls and the third subset of the plurality of circuit traces,
wherein a total Z-height of the first and second molding compounds comprises 100 micrometers or less.

* * * * *